United States Patent
Ogawa et al.

(10) Patent No.: US 9,912,235 B2
(45) Date of Patent: Mar. 6, 2018

(54) BOOST CONVERTER

(71) Applicant: Kabushiki Kaisha Toshiba, Minato-ku (JP)

(72) Inventors: Taichi Ogawa, Inagai (JP); Takeshi Ueno, Kawasaki (JP); Tetsuro Itakura, Nerima (JP); Osamu Watanabe, Chigasaki (JP); Takayuki Miyazaki, Setagaya (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/257,312

(22) Filed: Sep. 6, 2016

(65) Prior Publication Data
US 2017/0070138 A1 Mar. 9, 2017

(30) Foreign Application Priority Data
Sep. 8, 2015 (JP) .................... 2015-176845

(51) Int. Cl.
*H02M 3/156* (2006.01)
*H02M 3/07* (2006.01)
(Continued)

(52) U.S. Cl.
CPC ............. *H02M 3/156* (2013.01); *H02M 1/36* (2013.01); *H02M 3/07* (2013.01);
(Continued)

(58) Field of Classification Search
CPC . H02M 2001/0006; H02M 2001/0025; H02M 1/36; H02M 3/156; H02M 3/158; H02M 3/1588; H02M 3/07
See application file for complete search history.

(56) References Cited

U.S. PATENT DOCUMENTS

| 4,864,213 A | * | 9/1989 | Kido | ...................... H02M 1/36 323/222 |
| 2006/0082352 A1 | * | 4/2006 | Warita | .................... H02M 1/36 323/272 |

(Continued)

OTHER PUBLICATIONS

Hong Gao et al. "A 60 mV-3 Input Range Boost Converter with Amplitude-Regulated and Intermittently Operating Oscillator for Energy Harvesting", IEEE Applied Power Electronics Conference and Exposition (APEC), 2015, 8 pages.

*Primary Examiner* — Fred E Finch, III
(74) *Attorney, Agent, or Firm* — Oblon, McClelland, Maier & Neustadt, L.L.P.

(57) ABSTRACT

A boost converter includes an input, an output, a startup circuit, a first switch, a comparator circuit, a switching circuit, a control circuit, a converter circuit, and a switch control circuit. The startup circuit boosts an input voltage up to a first output voltage. The comparator circuit outputs a first signal corresponding to the difference between the output voltage and a first reference voltage. The switching circuit outputs a second voltage based on the first signal. The control circuit outputs a second signal corresponding to the difference between the output voltage and a second reference voltage. The converter circuit boosts the input voltage based on the second signal, and outputs the output voltage. The switch control circuit generates a third signal based on the second signal, and outputs the third signal to the first switch.

6 Claims, 6 Drawing Sheets

(51) Int. Cl.
*H02M 1/36* (2007.01)
*H02M 1/00* (2006.01)
*H03K 3/0233* (2006.01)
*H03K 5/24* (2006.01)

(52) U.S. Cl.
CPC ............ *H02M 2001/0006* (2013.01); *H02M 2001/0025* (2013.01); *H03K 3/02337* (2013.01); *H03K 5/2481* (2013.01)

(56) References Cited

U.S. PATENT DOCUMENTS

| | | | | |
|---|---|---|---|---|
| 2007/0290666 | A1* | 12/2007 | Hachiya | H02M 3/156 323/282 |
| 2012/0286755 | A1* | 11/2012 | Itou | H02M 1/36 323/284 |
| 2014/0159688 | A1* | 6/2014 | Peker | H02M 3/1582 323/282 |
| 2016/0079852 | A1* | 3/2016 | Lai | H02M 3/158 323/271 |

* cited by examiner

BOOST CONVERTER

CROSS-REFERENCE TO RELATED APPLICATION

This application is based upon and claims the benefit of priority from Japanese Patent Application No. 2015-176845, filed on Sep. 8, 2015; the entire contents of which are incorporated herein by reference.

FIELD

Embodiments described herein relate generally to a boost converter.

BACKGROUND

A boost converter generally increases a power supply voltage to drive a control circuit from an output voltage. When the output voltage is lower than a voltage capable of driving the control circuit, however, boosting the input voltage by using a startup circuit is needed to increases the power supply voltage capable of driving the control circuit. When the control circuit starts to operate by the startup circuit, the output voltage rises. When the output voltage exceeds the voltage capable of driving the control circuit, the control circuit starts to operate by the output voltage. Since the output voltage of the startup circuit becomes unnecessary at this point, operation of the startup circuit can then be stopped. Stopping the startup circuit suppresses power consumption and raises the efficiency of the whole boost converter.

The input voltage is input to the startup circuit via a switch for the startup circuit. Using a normally-on-type switch which is in an on-state even when a gate does not increase a voltage can make the input voltage input to the startup circuit. A negative voltage is then necessary to turn off the normally-on-type switch. In a background boost converter, an internal oscillator of the startup circuit is used to apply the negative voltage. The internal oscillator outputs a voltage oscillating positively and negatively around ground potential. The output is rectified and retained. When the control circuit is driven by the output voltage, the negative voltage is capable of turning the switch for the startup circuit off. When the switch for the startup circuit is turned off, the startup circuit is stopped by lack of the input voltage.

The negative voltage capable of turning the switch for the startup circuit off is held by a capacitor. The negative voltage held by the capacitor may change over time, however, so it is necessary to refresh the negative voltage. In a background technique, it is necessary to drive the oscillator of the startup circuit for refreshing the negative voltage held by the capacitor again. Therefore, the oscillator of the startup circuit consumes electric power, the power consumption of the boost converter increases, and then a problem of a decrease in efficiency of the boost converter arises.

DETAILED DESCRIPTION

The present boost converters are not limited to the embodiments. A boost converter according to an embodiment described herein includes an input, an output, a startup circuit, a first switch, a comparator circuit, a switching circuit, a control circuit, a converter circuit, and a switch control circuit. The input that receives an input voltage. The output that outputs an output voltage. The startup circuit that boosts the input voltage up to a first voltage. The first switch connected between the input and the startup circuit. The comparator circuit that receives as inputs the output voltage and a first reference voltage, and outputs a first signal corresponding to the difference between the output voltage and the first reference voltage. The switching circuit that receives as inputs the first voltage, the output voltage, and the first signal, and outputs the first voltage or the output voltage as a second voltage based on the first signal. The control circuit that receives as inputs the output voltage and the second voltage, and outputs a second signal corresponding to the difference between the output voltage and a second reference voltage by using the second voltage as a power source. The converter circuit that receives as inputs the input voltage and the second signal, boosts the input voltage based on the second signal, and outputs the output voltage. The switch control circuit that receives as inputs the first signal and the second signal, determines whether to output a third signal for controlling the on-off of the first switch based on the first signal, generates the third signal based on the second signal, and outputs the third signal to the first switch.

Embodiments will now be explained with reference to the accompanying drawings.

The First Embodiment

Figure 1:
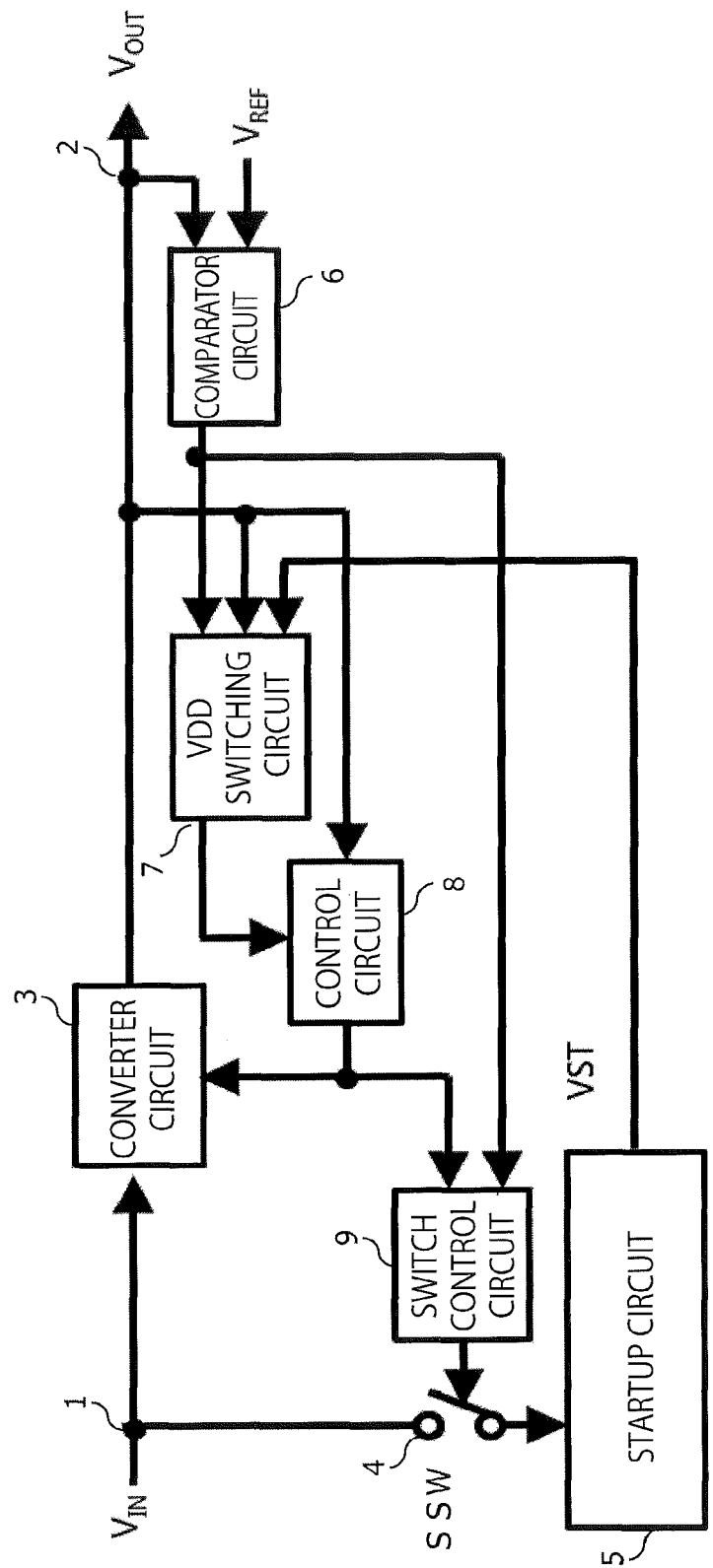
FIG. 1 is a block diagram showing a schematic configuration of a boost converter according to a first embodiment.

FIG. 1 is a block diagram showing a schematic configuration of a boost converter according to a first embodiment. The boost converter according to this embodiment outputs a predetermined output voltage VOUT from an input voltage VIN. The boost converter includes an input 1, an output 2, a converter circuit 3, a startup circuit switch (SSW) 4, a startup circuit 5, a comparator circuit 6, a VDD switching circuit 7, a control circuit 8, and a switch control circuit 9.

Each component is explained below.

The input 1 is connected to a DC power supply (not illustrated), and receives as an input the input voltage VIN. The output 2 is connected to a load (not illustrated), and outputs the output voltage VOUT.

The converter circuit 3 is a circuit converting voltage. The converter circuit 3 is connected between the input 1 and the output 2. The converter circuit 3 outputs the output voltage VOUT from the input voltage VIN by turning on and off an internal switch.

The startup circuit switch (SSW) 4 is connected to the input 1 at one end, and receives as an input the input voltage VIN. When the SSW 4 is turned on, the SSW 4 outputs the input voltage VIN to the startup circuit 5 connected to it at its other end.

The startup circuit 5 boosts the input voltage VIN, and outputs DC voltage VST to the VDD switching circuit 7.

The comparator circuit 6 compares the output voltage VOUT with a reference voltage VREF input externally, and outputs a comparing result signal to the VDD switching circuit 7.

The VDD switching circuit 7 receives as inputs the output voltage VST from the startup circuit 5, the output voltage VOUT, and the comparing result signal. The VDD switching circuit 7 outputs VST or VOUT to the control circuit 8 based on the comparing result signal.

The control circuit 8 receives as an input VST or VOUT from VDD switching circuit 7 as a power supply voltage to drive the control circuit 8 itself. The control circuit 8 also receives as an input VOUT from converter circuit 3 in addition to the power supply voltage. The control circuit 8 outputs an on-off control signal for switching the internal switch of the converter circuit 3 to the converter circuit 3 to set the value of the output voltage VOUT to a predetermined value. The on-off control signal is also output to the switch control circuit 9 controlling the on-off of the SSW 4.

The switch control circuit 9 receives as inputs the on-off control signal from the control circuit 8 and the comparing result signal from the comparator circuit 6. The switch control circuit 9 outputs the on-off control signal for the SSW 4 based on the comparing result signal.

At first, the operation of the boost converter, before the output voltage VOUT exceeds the reference voltage VREF, is explained hereinafter. If SSW 4 is turned on, the input voltage VIN is input to the startup circuit 5, and the startup circuit 5 outputs VST to the VDD switching circuit 7. The VDD switching circuit 7 receives as inputs the VST and the comparing result signal indicating "VOUT<VREF". In the case of "VOUT<VREF", the VDD switching circuit 7 selects VST, and supplies the selected VST to the control circuit 8. The control circuit 8 is driven by VST, and outputs the on-off control signal to the converter circuit 3. The converter circuit 3 boosts VIN up to VOUT, and outputs boosted up VOUT.

Next, the operation of the boost converter, after the output voltage VOUT exceeds the reference voltage VREF, is explained hereinafter. When VOUT gradually becomes larger and exceeds VREF, the comparator circuit 6 outputs the comparing result signal meaning "VOUT>VREF" to the VDD switching circuit 7 and the switch control circuit 9. When the VDD switching circuit 7 receives as an input the result signal indicating "VOUT<VREF", it supplies VST to the control circuit 8, as noted above. When the VDD switching circuit 7 receives as an input the result signal indicating "VOUT>VREF", however, it supplies VOUT to the control circuit 8. When the switch control circuit 9 receives as an input the result signal indicating "VOUT>VREF", it generates a voltage for turning off the SSW 4 by using the on-off control signal from the control circuit 8, and turns off the SSW 4. For example, the switch control circuit 9 includes a switched capacitor circuit 93 (see FIG. 3), and can generate a desired voltage by using the on-off control signal as a clock signal. When the SSW 4 is turned off, the input voltage is not input to the startup circuit 5, and then the startup circuit 5 stops.

Figure 2:
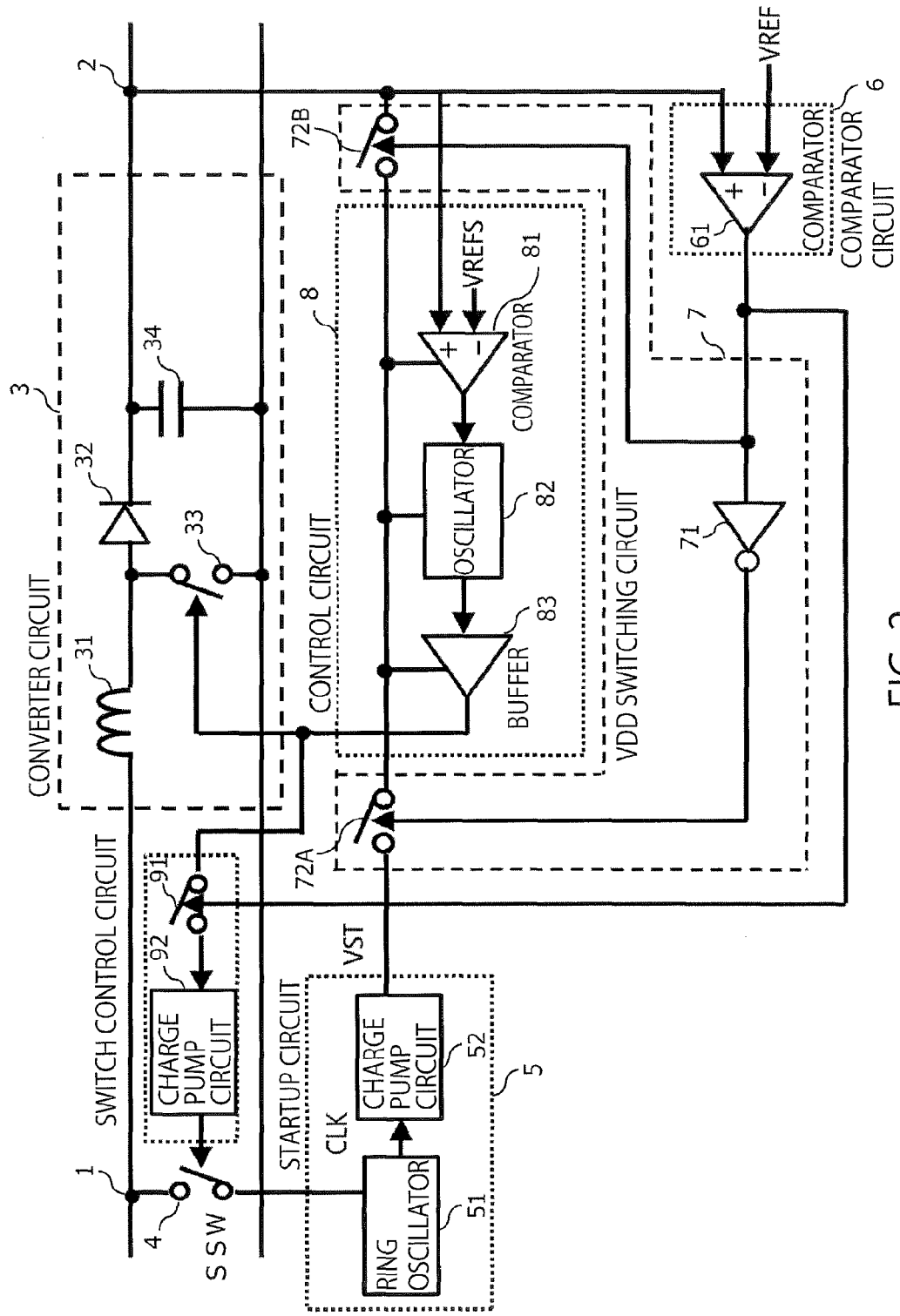
FIG. 2 is a circuit diagram showing a schematic configuration of a boost converter according to the first embodiment.

FIG. 2 is a circuit diagram showing a schematic configuration of a boost converter according to this embodiment. The details of each component are explained below.

The converter circuit 3 includes an inductor 31, a diode 32, a switch 33, and a capacitor 34. The inductor 31 is connected to the input unit 1 at one end, and to the diode 32 and the switch 33 at the other end. The switch 33 is grounded at one end, and connected to the diode 32 at the other end. The anode of the diode 32 is connected to the inductor 31. The cathode of the diode 32 is connected to the capacitor 34 and the output unit 2. The diode 32 can supply the electric current from the inductor 31 to the capacitor 34 and the output unit 2. The capacitor 34 is connected to the cathode of the diode 32 and the output unit 2, and grounded at the other end. The capacitor 34 operates as a smoothing capacitor. When the switch 33 is turned on and off by the on-off signal from the control circuit 8, the input voltage VIN is boosted up to the output voltage VOUT.

The startup circuit 5 includes a ring oscillator 51 and a charge pump circuit 52. When the startup circuit 5 receives as an input the input voltage VIN, the ring oscillator 51 operates and outputs a clock signal CLK. When the charge pump circuit 52 receives as an input the clock signal CLK, it outputs the DC voltage VST. Instead of the ring oscillator 51, a circuit which can convert a DC voltage to a clock signal or an AC signal, such as an LC oscillator, may be utilized in the startup circuit 5. The charge pump circuit 52 may include the switched capacitor circuit 93 (of FIG. 3) converting an AC signal such as the clock signal to a DC signal or a rectifier and so on.

The comparator circuit 6 includes a comparator 61. The comparator circuit 6 receives as an input the reference voltage VREF and VOUT. When VOUT is larger than VREF, the comparing result signal becomes HI (high). When VOUT is smaller than VREF, the comparing result signal becomes LOW. In the case that VOUT is used to the power supply voltage, the comparing result signal becomes LOW even if the comparator circuit 6 does not receive as an input the power supply voltage.

The VDD switching circuit 7 includes an inverter 71, a switch 72A, and a switch 72B. Both the switch 72A and the switch 72B are not in an on-state or off-state at the same time due to the inverter 71. When VOUT is smaller than VREF, the left side switch 72A in FIG. 2 turns on, the right side switch 72B turns off, and VST is supplied as the power supply voltage for the control circuit 8. When VOUT is larger than VREF, the left side switch 72A in FIG. 2 turns off, the right side switch 72B turns on, and VOUT is supplied as the power supply voltage for the control circuit 8.

The control circuit 8 includes a comparator 81, an oscillator 82, and a buffer 83. The comparator 81 receives as inputs VOUT and a reference voltage VREFS from internal of the control circuit 8. When VOUT is smaller than VREF, the comparator 81 outputs the signal HI, and the oscillator 82 operates. The oscillator 82 then outputs a clock signal. The clock signal is output to the converter circuit 3 and the switch control circuit 9 via the buffer 83 as the on-off control signal.

The switch control circuit 9 includes a switch 91 and a charge pump circuit 92. When the comparing result signal from the comparator circuit 6 is HI, the on-off control signal from the control circuit 8 is input to the charge pump circuit 92. The charge pump circuit 92 generates a control signal to turn on and off the SSW 4.

The SSW 4 when applied the off voltage by the control signal for the SSW 4 becomes in an off-state. Thus, the input voltage VIN is input to the startup circuit 5, and then the operation of the startup circuit 5 can be stopped.

A normally-on-type switch may be used for the SSW 4. The normally-on-type switch is a semiconductor switch which is conductive in the state that no voltage is applied to a gate of the switch. By using the normally-on-type switch, the switch SSW 4 is in an on-state if the voltage applied to the switch control circuit 9 is at ground potential. Thus, even if there is no power supply to drive an internal circuit of the boost converter, the input voltage VIN is input to the startup circuit 5 because the SSW 4 is in an on-state from the beginning. Therefore, SSW 4 can drive the startup circuit 5 without having to previously drive the switch control circuit 9.

As mentioned above, in this embodiment, the control signal for the converter circuit 3 output from the control circuit 8 is used for a stop signal for the SSW 4. Therefore, the power consumption of the startup circuit 5 can be suppressed by stopping the operation of the startup circuit 5 until it is necessary to operate. Because of the signal output from the control circuit 8, the startup circuit 5 does not have to prepare a new clock source to turn off the SSW 4. Therefore, power consumption can be further suppressed as compared with a background boost converter.

The Second Embodiment

Figure 3:
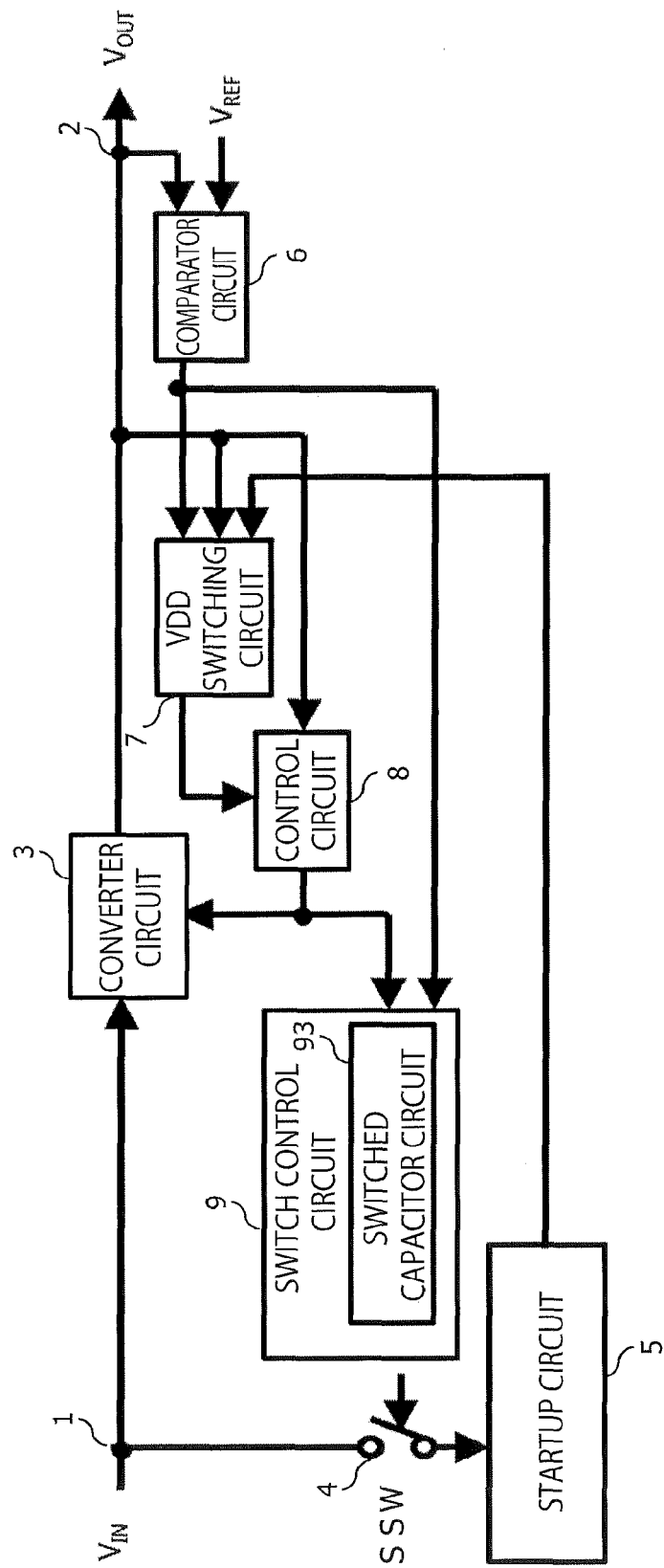
FIG. 3 is a block diagram showing a schematic configuration of a boost converter according to a second embodiment.

FIG. 3 is a block diagram showing a schematic configuration of a boost converter according to a second embodiment. The boost converter according to this second embodiment has the switched capacitor circuit 93 inside the switch control circuit 9. The other configurations are as same as the first embodiment, and their explanation is omitted.

The switched capacitor circuit 93 can adjust a resistance value by the clock signal. Therefore, by using the switched capacitor circuit 93, the voltage value of the control signal for the SSW 4 output from the switch control circuit 9 can be adjusted to an arbitrary value, such as a negative voltage or a larger voltage than the output voltage, and so on. Thus, it can operate without having to take switching operation of the switching element used for the SSW 4 into consideration.

As mentioned above, in this second embodiment, the boost converter can operate even in the case that the switch is a normally-on-type switch requiring negative voltage to turn off or larger voltage than a voltage of the both ends of the switch. Various switches can be used.

The Third Embodiment

Figure 4:
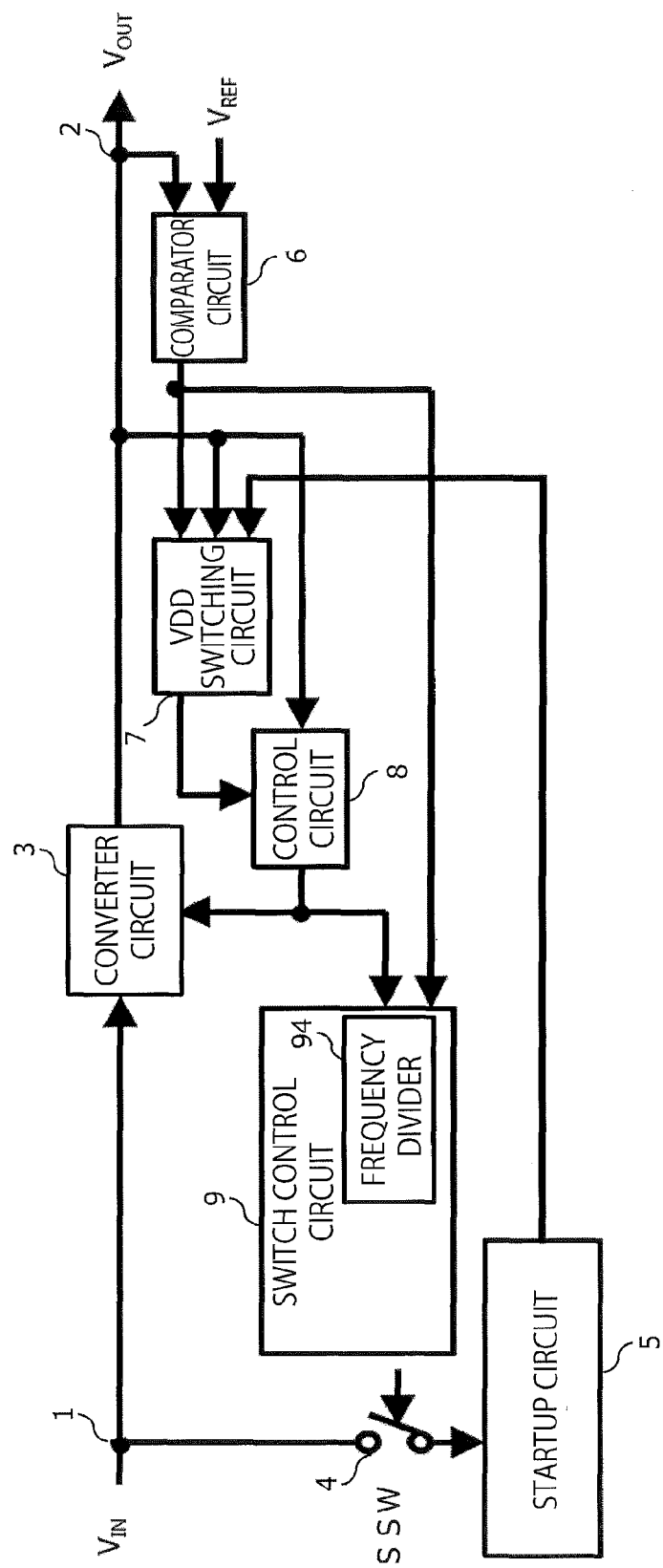
FIG. 4 is a block diagram showing a schematic configuration of a boost converter according to a third embodiment.

FIG. 4 is a block diagram showing a schematic configuration of a boost converter according to a third embodiment. The boost converter according to this third embodiment has a frequency divider 94 inside the switch control circuit 9. The other configurations are as same as the first and second embodiments, and their explanation is omitted.

The frequency divider 94 divides the clock signal input to the switch control circuit 9, that is, a frequency of the on-off control signal. The division ratio can be set to an arbitrary ratio. The operation of the charge pump circuit 92 or the switched capacitor circuit 93 in the switch control circuit 9 can be suppressed. Furthermore, the timing of turning on and off the SSW 4 and a period for refreshing the off voltage can be adjusted by dividing. The power consumption of the switch control circuit 9 can be suppressed by suppressing the period for refreshing the off voltage.

As mentioned above, in this third embodiment, the power consumption of the switch control circuit 9 can be suppressed by using the frequency divider 94.

The Fourth Embodiment

Figure 5:
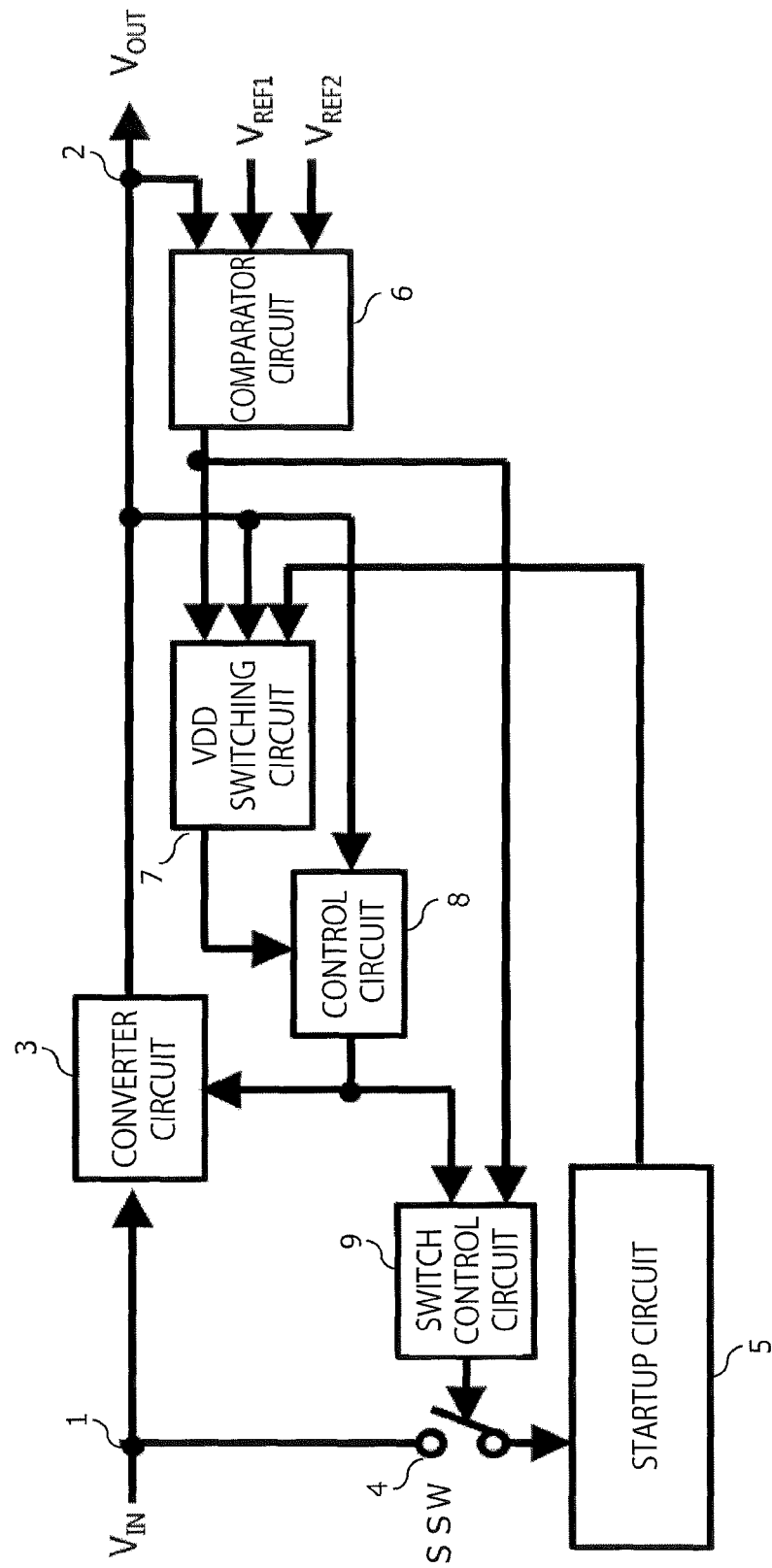
FIG. 5 is a block diagram showing a schematic configuration of a boost converter according to a fourth embodiment.

FIG. 5 is a block diagram showing a schematic configuration of a boost converter according to a fourth embodiment. The boost converter according to this fourth embodiment includes a comparator circuit 6 different from the above embodiments. The other configurations are as same as in the above embodiments, and their explanation is omitted.

Figure 6:
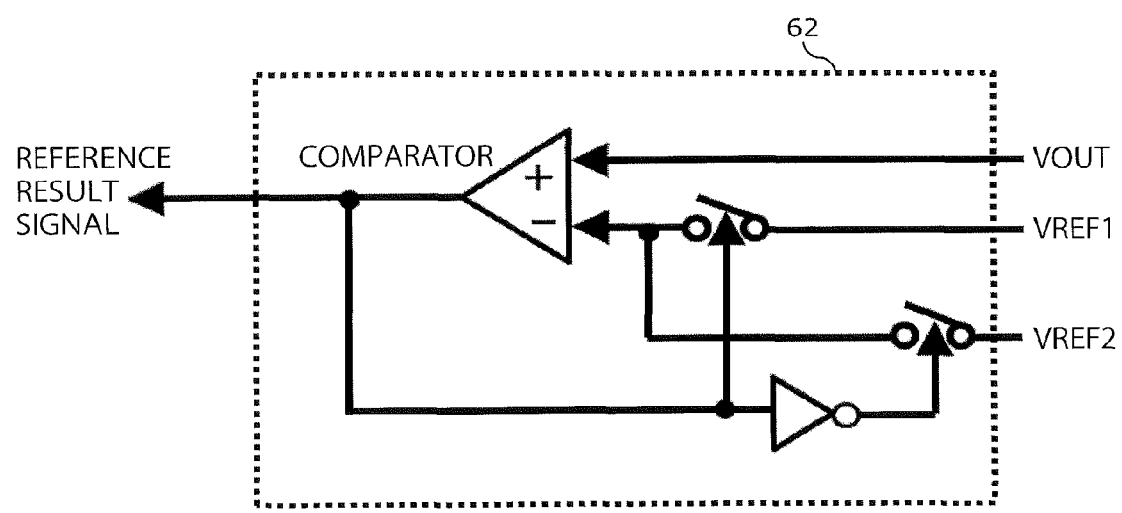
FIG. 6 is a diagram showing a comparator circuit with hysteresis.

The comparator circuit 6 in this fourth embodiment receives as inputs reference voltage VREF1, reference voltage VREF2, and the output voltage VOUT. A comparator with hysteresis 62 (a hysteresis 62) is adopted to the comparator circuit 6. FIG. 6 is a diagram showing the comparator circuit 6 with the hysteresis 62. The hysteresis 62 converts a reference signal to be compared with an input signal by the value of the previous output signal. The input signal is the output voltage VOUT, and the reference signal is the reference voltage VREF1 or the reference voltage VREF2 herein. The voltage VREF1 is larger than the reference voltage VREF2. When the previous comparing result signal is LOW, VREF1 is used for the reference signal. When the previous comparing result signal is HI, VREF2 is used for the reference signal.

By comparing the output voltage VOUT with the reference voltage VREF (VREF1 or VREF2) as in the above embodiments, a small fluctuation of VOUT caused by certain effects like noise may affect the comparing result. For example, if the difference between VOUT and VREF is very small, the plus and minus sign of the difference between VOUT and VREF frequently fluctuates. In this case, the comparing result signal output from the comparator circuit 6 fluctuates. As a result of this, the switching operation of the SSW 4 is frequently performed, and then the startup circuit 5 is frequently driven.

In this fourth embodiment, the reference voltage VREF1 and reference voltage VREF2 are adopted. Their difference of voltage is an arbitrary value. When the previous comparing result signal is LOW (that is, when the SSW 4 is off and the operation of the startup circuit 5 is stopped), the startup circuit 5 does not operate unless VOUT is larger than VREF1. Conversely, when the previous comparing result signal is HI (that is, when the SSW 4 is on and the operation of the startup circuit 5 is driven), the startup circuit 5 does not stop unless VOUT is smaller than VREF2. Thus, realizing the start-stop condition of the startup circuit 5 is harder than the above embodiments, and the operation of the startup circuit 5 is more stable. Therefore, unnecessary increase of power consumption of the startup circuit 5 can be further suppressed, and the efficiency of the boost converter further increases.

As mentioned above, in this fourth embodiment, the power consumption of the startup circuit 5 can be even further suppressed.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A boost converter, comprising:
an input that receives an input voltage;

an output that outputs an output voltage;

a startup circuit that boosts the input voltage up to a first voltage;

a first switch connected between the input and the startup circuit;

a comparator circuit that receives as inputs the output voltage and a first reference voltage, and outputs a first signal corresponding to the difference between the output voltage and the first reference voltage;

a switching circuit that receives as inputs the first voltage, the output voltage, and the first signal, and outputs the first voltage or the output voltage as a second voltage based on the first signal;

a control circuit that receives as inputs the output voltage and the second voltage, and outputs a second signal corresponding to the difference between the output voltage and a second reference voltage by using the second voltage as a power source;

a converter circuit that receives as inputs the input voltage and the second signal, boosts the input voltage based on the second signal, and outputs the output voltage; and a switch control circuit that receives as inputs the first signal and the second signal, determines whether to output a third signal for controlling the on-off of the first switch based on the first signal, generates the third signal based on the second signal, and outputs the third signal to the first switch.

2. The boost converter according to claim 1, wherein the converter circuit includes:

an inductor connected to the input at a first end, a second switch grounded at a first end and connected to a second end of the inductor at a second end, a capacitor connected to the output at a first end and grounded at a second end, and a diode whose anode is connected to the second end of the inductor and whose cathode is connected to the first end of the capacitor.

3. The boost converter according to claim 1, wherein the first switch includes a normally-on-type switch device that is in an on-state before receiving as an input the third signal.

4. The boost converter according to claim 1, wherein the switch control circuit further includes a switched capacitor, and the switched capacitor sets a voltage value of the third signal to a predetermined value based on the second signal.

5. The boost converter according to claim 1, wherein the switch control circuit further includes a frequency divider, and the frequency divider divides the frequency of the second signal to one-Nth (N is an integer of 1 or more), and generates or outputs the third signal by using the divided frequency.

6. The boost converter according to claim 1, wherein the comparator circuit further receives as an input a third reference voltage, selects the second reference voltage or the third reference voltage based on a feedback signal of the first signal, and outputs a new first signal based on the difference between the second reference voltage or the third reference voltage and the output voltage.

* * * * *